(12) United States Patent
Kishimoto et al.

(10) Patent No.: US 11,223,305 B2
(45) Date of Patent: Jan. 11, 2022

(54) VEHICLE DRIVING DEVICE

(71) Applicant: TOYOTA JIDOSHA KABUSHIKI KAISHA, Toyota (JP)

(72) Inventors: Naoyuki Kishimoto, Susono (JP); Hiroshi Yaguchi, Susono (JP); Shuichi Iwata, Nissin (JP); Naoki Marukawa, Numazu (JP); Hirotaka Koyanagi, Yokohama (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 148 days.

(21) Appl. No.: 16/681,971

(22) Filed: Nov. 13, 2019

(65) Prior Publication Data

US 2020/0161993 A1 May 21, 2020

(30) Foreign Application Priority Data

Nov. 16, 2018 (JP) .............................. JP2018/215984
Sep. 27, 2019 (JP) .............................. JP2019-176591

(51) Int. Cl.
| H02K 5/04 | (2006.01) |
| H02K 9/19 | (2006.01) |
| H02P 5/753 | (2006.01) |
| H02K 7/00 | (2006.01) |

(52) U.S. Cl.
CPC .............. *H02P 5/753* (2013.01); *H02K 5/04* (2013.01); *H02K 7/006* (2013.01); *H02K 9/19* (2013.01); *H02P 2201/09* (2013.01)

(58) Field of Classification Search
CPC . H02K 5/04; H02K 7/006; H02K 9/19; H02P 2201/09; H02P 5/753
See application file for complete search history.

(56) References Cited

U.S. PATENT DOCUMENTS

| 7,760,503 | B2 * | 7/2010 | Aoki | H01L 23/473 |
| | | | | 361/699 |
| 7,932,624 | B2 * | 4/2011 | Yoshida | B60K 6/365 |
| | | | | 307/9.1 |
| 7,965,510 | B2 * | 6/2011 | Suzuki | B60K 6/405 |
| | | | | 361/699 |
| 8,064,198 | B2 * | 11/2011 | Higashidani | H05K 7/20927 |
| | | | | 361/679.53 |
| 9,358,870 | B2 * | 6/2016 | Hotta | B60K 6/40 |
| 9,385,629 | B2 * | 7/2016 | Nagase | H05K 7/1432 |
| 2009/0294195 | A1 * | 12/2009 | Otsuka | H05K 7/20927 |
| | | | | 180/65.275 |
| 2010/0084206 | A1 * | 4/2010 | Yoshida | B60W 20/00 |
| | | | | 180/65.1 |
| 2017/0355272 | A1 * | 12/2017 | Baba | B60L 50/51 |

FOREIGN PATENT DOCUMENTS

| JP | 2012-065436 A | | 3/2012 |
| JP | 2012065436 A | * | 3/2012 |

* cited by examiner

*Primary Examiner* — Thai T Dinh
(74) *Attorney, Agent, or Firm* — Sughrue Mion, PLLC

(57) ABSTRACT

A vehicle driving device includes a case that accommodates therein a first rotary electric machine and a second rotary electric machine arranged with rotation axes thereof parallel to each other and radially adjacent to each other, and a power control device that controls electric power supplied to the first rotary electric machine and the second rotary electric machine. In the power control device, a control board, a power card and a cooler, a reactor and a capacitor, and a water jacket are disposed in order from top in a height direction.

5 Claims, 12 Drawing Sheets

VEHICLE DRIVING DEVICE

CROSS-REFERENCE TO RELATED APPLICATION(S)

The present application claims priority to and incorporates by reference the entire contents of Japanese Patent Application Nos. 2018-215984 filed in Japan on Nov. 16, 2018 and 2019-176591 filed in Japan on Sep. 27, 2019.

BACKGROUND

The present disclosure relates to a vehicle driving device.

Japanese Laid-open Patent Publication No. 2012-065436 A discloses a vehicle driving device in which, in a case which accommodates therein a first rotary electric machine and a second rotary electric machine that are arranged so as to have respective rotation axes parallel to each other and radially adjacent to each other, a power control unit (PCU), that is a power control device for controlling the power supplied to the first rotary electric machine and the second rotary electric machine, is directly mounted. This vehicle driving device includes a terminal board fixed so as to cover an opening provided in the case, while holding rotary electric machine connection terminals connected to the rotary electric machines, and a reactor serving as a part of the power control unit. The reactor is fixed to the terminal board on the inner side of the case, and reactor connection terminals connected to the reactor, in addition to the rotary electric machine connection terminals, are held by the terminal board so as to be exposed to the exterior of the case.

SUMMARY

There is a need for providing a vehicle driving device capable of improving the arrangement of power control unit.

According to an embodiment, a vehicle driving device includes: a case that accommodates therein a first rotary electric machine and a second rotary electric machine arranged with rotation axes thereof parallel to each other and radially adjacent to each other; and a power control device that controls electric power supplied to the first rotary electric machine and the second rotary electric machine. Further, in the power control device, a control board, a power card and a cooler, a reactor and a capacitor, and a water jacket are disposed in order from top in a height direction.

DETAILED DESCRIPTION

Figure 1:
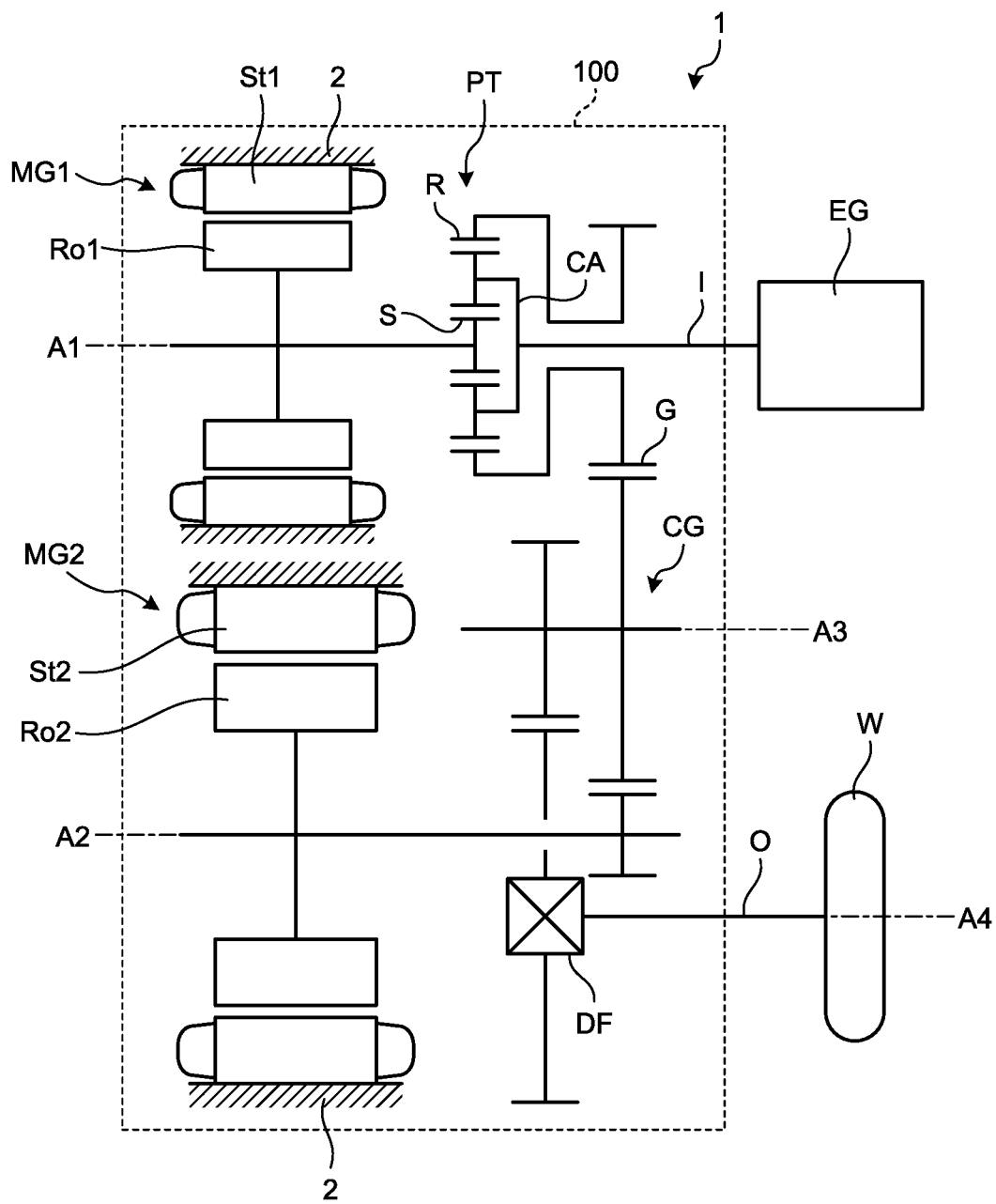
FIG. 1 is a skeleton diagram of a vehicle driving device according to a first embodiment.

In the related-art, there is room for improvement in the arrangement of the PCU in the vehicle driving device. For example, the recessed space formed between the first rotary electric machine and the second rotary electric machine is not effectively used, resulting in a large height (mounting height) of the PCU mounted on the case.

First Embodiment

A first embodiment of a vehicle driving device according to the present disclosure will be described below. The present disclosure is not limited by the present embodiment. In the present embodiment, a case where a vehicle driving device according to the present disclosure is applied to a vehicle driving device provided with both an internal combustion engine and a rotary electric machine as driving force sources for the vehicle will be described as an example. In the following, unless otherwise specified, the direction parallel to the rotation axis of the rotary electric machine is described as the "axial direction". With the front in the front-rear direction of the vehicle on which the vehicle driving device is mounted denoted as "FR", the right side in the lateral direction of the vehicle denoted as "RH", and the upper side in the height direction of the vehicle denoted as "UPPER", the directions are illustrated with arrows in the drawings as appropriate.

FIG. 1 is a skeleton diagram of a vehicle driving device according to the embodiment. A vehicle driving device 1 according to the embodiment includes two rotary electric machines, that is, a first rotary electric machine MG1 and a second rotary electric machine MG2, functioning as driving force sources for a vehicle together with an internal combustion engine EG and housed inside a transaxle case 2.

First, the entire configuration of the vehicle driving device 1 will be described. As illustrated in FIG. 1, the vehicle driving device 1 includes an input shaft I drivingly coupled to the internal combustion engine EG, the first rotary electric machine MG1, the second rotary electric machine MG2, a power distribution device PT, an output gear G, a counter gear mechanism C, and a differential device DF. Each of these components is accommodated in the transaxle case 2 fixed to the vehicle body.

The input shaft I is drivingly coupled to the internal combustion engine EG. Here, the internal combustion engine EG is a device driven by combustion of a fuel inside the engine to take out motive power, and for example, various known engines, such as a gasoline engine and a diesel engine, can be used. In the present embodiment, the input shaft I is drivingly coupled to rotate integrally with an output rotation shaft, such as a crankshaft, of the internal combustion engine EG. The input shaft I is also preferably drivingly coupled to the output rotation shaft of the internal combustion engine EG via another member such as a damper or a clutch.

The first rotary electric machine MG1 has a first stator St1 fixed to the transaxle case 2 and a first rotor Ro1 rotatably supported radially inward of the first stator St1. The first rotor Ro1 of the first rotary electric machine MG1 is drivingly coupled to rotate integrally with a sun gear S of the power distribution device PT. Furthermore, the second rotary electric machine MG2 has a second stator St2 fixed to the transaxle case 2 and a second rotor Ro2 rotatably supported radially inward of the second stator St2. The second rotor Ro2 of the second rotary electric machine MG2 is drivingly coupled to the differential device DF via the counter gear mechanism C. The first rotary electric machine MG1 and the second rotary electric machine MG2 are each electrically connected to a battery (not illustrated) as a power storage device. Note that the battery is an example of a power storage device, and another power storage device such as a capacitor can be used, or a plurality of types of power storage devices can be used in combination. Furthermore, the battery can be configured to be chargeable by an external power supply such as a household power supply.

The first rotary electric machine MG1 and the second rotary electric machine MG2 can each have a function as a motor (electric motor) generating motive power upon receiving supply of electric power, and a generator (electric generator) generating electric power upon receiving supply of motive power. Here, when the first rotary electric machine MG1 and the second rotary electric machine MG2 function as a generator, they generate electric power by the torque of the internal combustion engine EG or the inertia force of the vehicle, charge the battery, or supply electric power to drive the other rotary electric machine functioning as a motor. When the first rotary electric machine MG1 and the second rotary electric machine MG2 function as a motor, they receive the electric power charged in the battery or generated by the other rotary electric machine functioning as a generator to perform power running.

As illustrated in FIG. 1, the power distribution device PT is configured by a single pinion-type planetary gear mechanism disposed coaxially with the input shaft I. That is, the power distribution device PT includes, as rotating elements, a carrier CA supporting a plurality of pinion gears, and a sun gear S and a ring gear R meshing with the pinion gears. Among these three rotating elements, the sun gear S has the highest rotational speed, followed by the carrier CA, and the ring gear R has the lowest rotational speed. The sun gear S is drivingly coupled to rotate integrally with the first rotor Ro1 of the first rotary electric machine MG1. The carrier CA is drivingly coupled to rotate integrally with the input shaft I. The ring gear R is drivingly coupled to rotate integrally with an output gear G formed radially outward of the input shaft I between the power distribution device PT and the internal combustion engine EG in the axial direction.

The power distribution device PT has a function of distributing the driving force of the internal combustion engine EG (here, "driving force" is used synonymously with "torque") input via the input shaft I to the first rotary electric machine MG1 and the output gear G. Furthermore, by controlling the rotational speed and torque of the first rotary electric machine MG1 in a state where the torque of the input shaft I (internal combustion engine EG) is input to the carrier CA of the power distribution device PT, the rotational speed of the input shaft I can be steplessly varied and transmitted to the output gear G.

The output gear G is drivingly coupled to the differential device DF via the counter gear mechanism C. In addition, the second rotor Ro2 of the second rotary electric machine MG2 is drivingly coupled to the differential device DF via the counter gear mechanism C. Thus, in the present embodiment, the second rotor Ro2 of the second rotary electric machine MG2 is drivingly coupled to the output gear G via the counter gear mechanism C. Thus, in the present embodiment, a part of the torque of the input shaft I (internal combustion engine EG) distributed to the output gear G by the power distribution device PT and the output torque of the second rotary electric machine MG2 are combined and transmitted to the differential device DF. The differential device DF is drivingly coupled to wheels W via an axle O, and distributes and transmits the rotation and torque input to the differential device DF to two right wheels W and two left wheels W.

Figure 2:
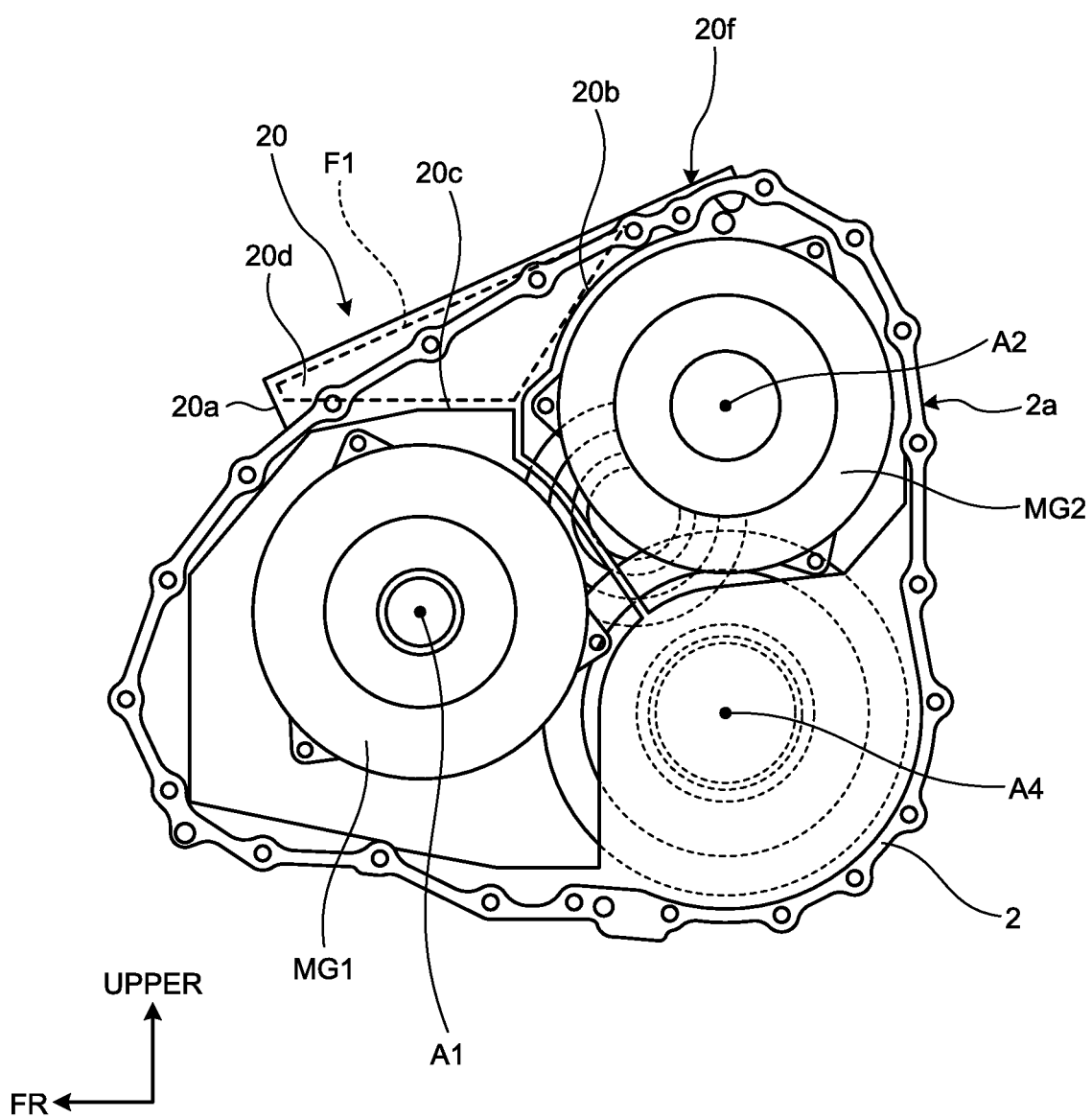
FIG. 2 is a cross-sectional view orthogonal to the axial direction of a case on which the PCU is not mounted.
Figure 3:
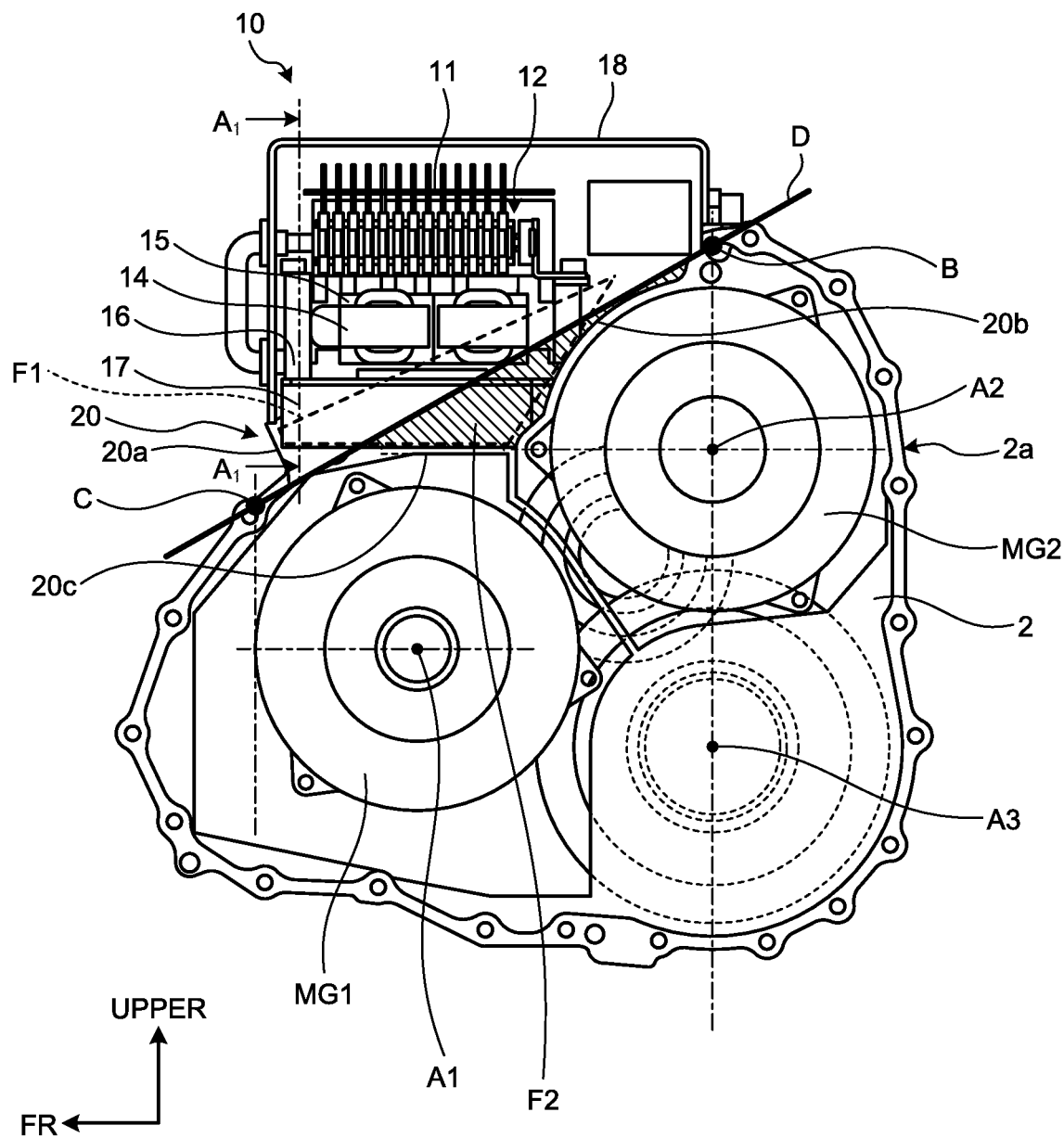
FIG. 3 is a cross-sectional view orthogonal to the axial direction of the case on which the PCU is mounted.
Figure 4:
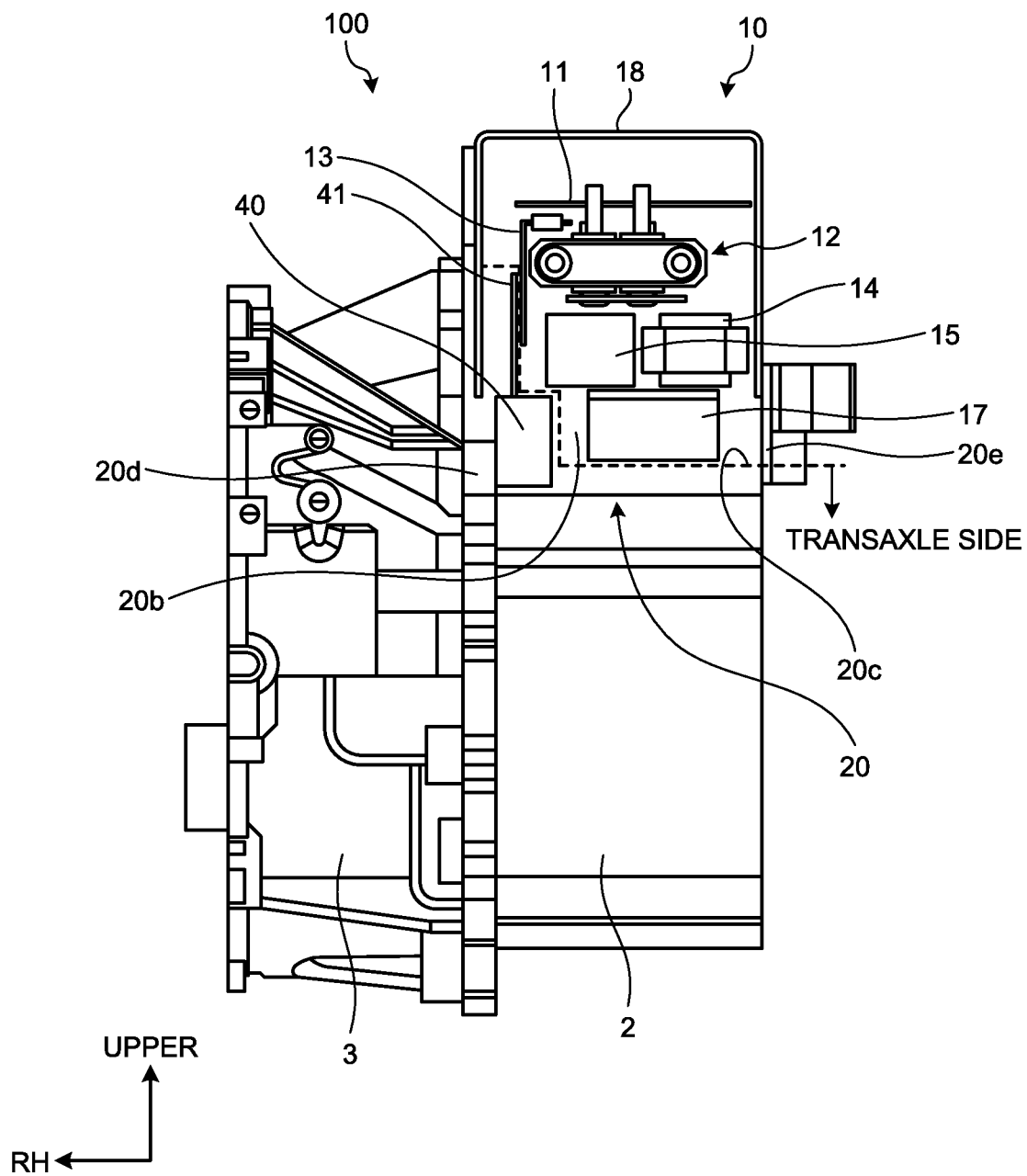
FIG. 4 is a view of a PCU mounting portion on which the PCU is mounted, cut along the $A_1$-$A_1$ cross section in FIG. 3.

FIG. 2 is a cross-sectional view orthogonal to the axial direction of the transaxle case 2 on which the PCU 10 is not mounted. FIG. 3 is a cross-sectional view orthogonal to the axial direction of the transaxle case 2 on which the PCU 10 is mounted. FIG. 4 is a view of a PCU mounting portion 20 on which the PCU 10 is mounted, cut along the $A_1$-$A_1$ cross section in FIG. 3.

A transaxle 100 includes the transaxle case 2 that accommodates therein the first rotary electric machine MG1 and the second rotary electric machine MG2 as described above, a transaxle housing 3 connected to one side of the transaxle case 2 (the side on which the internal combustion engine EG is disposed), and a cover (not illustrated) connected to the other side of the transaxle case 2 (opposite to the side on which the internal combustion engine EG is disposed), which are integrally assembled.

In the transaxle 100 according to the present embodiment, the input shaft I, the power distribution device PT, the first rotary electric machine MG1, and the output gear G are all disposed on a first axis A1. The second rotary electric machine MG2 is disposed on a second axis A2. The counter gear mechanism C is disposed on a third axis A3. The differential device DF is disposed on a fourth axis A4. These axes are arranged parallel to one another and at different positions. In the present embodiment, the second rotary electric machine MG2 is disposed obliquely above the first rotary electric machine MG1. Furthermore, as illustrated in FIG. 2, the first axis A1, the second axis A2, and the fourth axis A4 are arranged such that line segments connecting these three axes form an acute triangle. The first rotary electric machine MG1 arranged on the first axis A1, the second rotary electric machine MG2 arranged on the second axis A2, and the differential device DF arranged on the fourth axis A4 are arranged adjacent to each other in the radial direction. The third axis A3 on which the counter gear mechanism C is disposed is disposed inside the acute-angled triangle formed by connecting the three axes of the first axis A1, the second axis A2, and the fourth axis A4.

The transaxle case 2 includes an outer circumferential wall 2a that covers at least the outer circumference in the radial direction of the first rotary electric machine MG1 and the second rotary electric machine MG2. The outer circumferential wall 2a is formed in an irregular cylindrical shape so as to cover the first rotary electric machine MG1, the second rotary electric machine MG2, and the differential device DF, which are disposed adjacent to each other in the radial direction, along their outer circumferential surfaces. The transaxle case 2 is formed using a metal material such as aluminum.

The PCU mounting portion 20 having a mounting area F1 for mounting the power control unit (PCU) 10 is provided on the outer circumferential surface of the outer circumferential wall 2a on an upper portion of the transaxle case 2. The PCU mounting portion 20 has a box shape with an open upper surface, and has a front wall 20a and a rear wall 20b opposed in the longitudinal direction of the vehicle, a right wall 20d and a left wall 20e opposed in the lateral direction of the vehicle, a bottom wall 20c forming the bottom, and an opening 20f opening the upper surface. The rear wall 20b and the bottom wall 20c are parts of the outer circumferential wall 2a of the transaxle case 2. The rear wall 20b is inclined rearward with respect to the bottom wall 20c in the longitudinal direction of the vehicle, and the rear wall 20b and the bottom wall 20c form an obtuse angle on a cross section perpendicular to the axial direction of the transaxle case 2. Furthermore, the angle defined by the rear wall 20b and the bottom wall 20c is located in a recessed space formed between the first rotary electric machine MG1 and the second rotary electric machine MG2.

Figure 5:
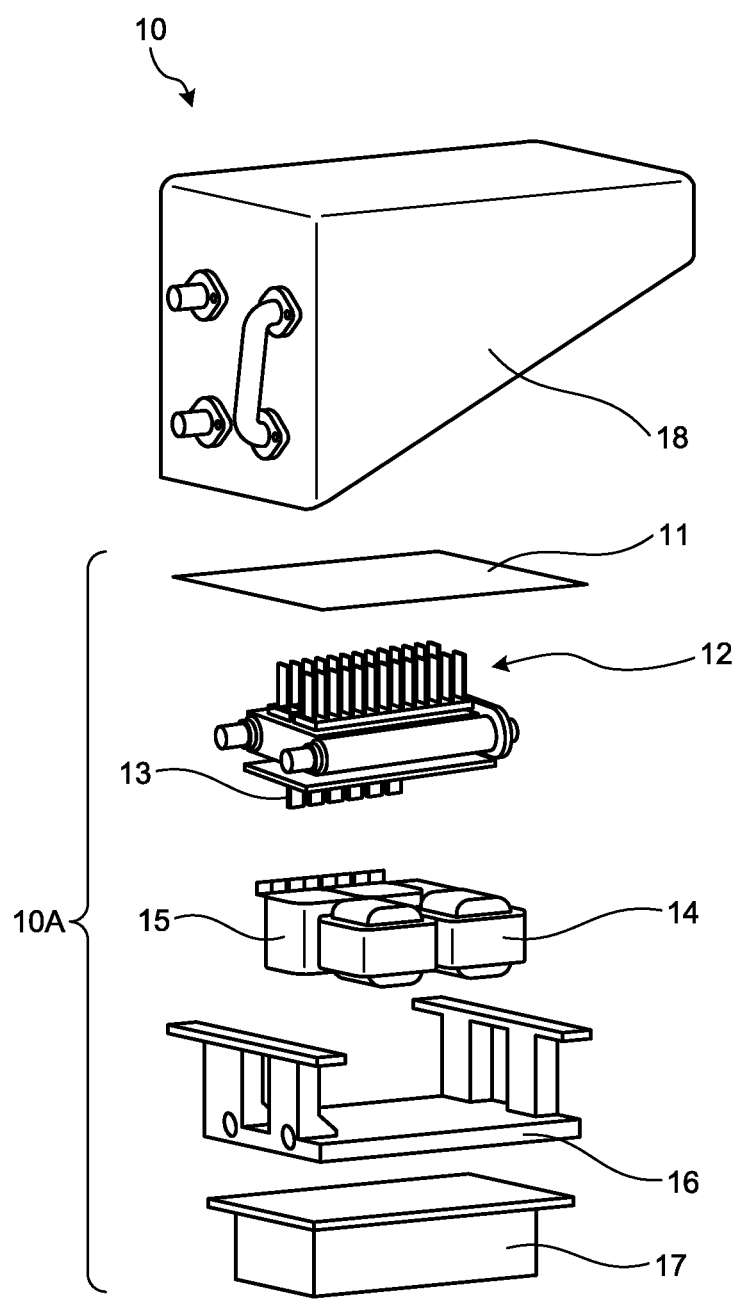
FIG. 5 is an exploded view of the PCU.

FIG. 5 is an exploded view of the PCU 10. As illustrated in FIG. 5, the PCU 10 includes a control board 11, a power stack 12, a PCU-side bus bar 13, a reactor 14, a capacitor 15, a water jacket 16, a DC-DC converter 17, and a PCU cover 18, for example.

The power stack 12 includes a stack of a plurality of power cards formed by modularizing insulated gate bipolar transistors (IGBTs) and diodes that control the first rotary electric machine MG1 and the second rotary electric machine MG2 with a cooling plate of a cooler interposed therebetween and is controlled by the control board 11. The PCU-side bus bar 13 serving as a first connection terminal is electrically connected to a transaxle-side bus bar 41 serving as a second connection terminal. The reactor 14 is used to boost the battery voltage. The capacitor 15 smoothes the DC voltage from the DC-DC converter 17 and supplies the smoothed DC current to the power stack 12, and smoothes the DC voltage from the power stack 12 and supplies the smoothed DC voltage to the DC-DC converter 17. The water jacket 16 cools the reactor 14, the DC-DC converter 17 and the like with cooling water passing through a water passage provided therein, and also serves as a holder for holding the power stack 12, the reactor 14, the capacitor 15 and the like. The DC-DC converter 17 lowers the DC voltage from the battery or the PCU 10, supplies the lowered DC voltage to auxiliary equipment such as vehicle lighting, and charges a battery for the auxiliary equipment. The PCU cover 18 has a box-like shape with an open lower surface, and is attached to the upper portion of the PCU mounting portion 20 to close the opening 20f. Furthermore, the depth of the PCU cover 18 gradually increases from the rear side to the front side of the vehicle in the longitudinal direction of the vehicle so as to surround most of the circumference of a PCU assembly 10A described later.

In the present embodiment, the PCU 10 has a multilayer structure in the height direction, and the control board 11, the power stack 12, the reactor 14 and the capacitor 15, the water jacket 16, and the DC-DC converter 17 are stacked in order from the upper side (side opposite to the transaxle 100 side) in the height direction of the PCU 10 and integrated to form the PCU assembly 10A. In the PCU assembly 10A, the power stack 12, the reactor 14 and the capacitor 15, and the DC-DC converter 17 are fastened to the water jacket 16. A power card and a cooler included in the power stack 12 form the same layer in the PCU assembly 10A. The reactor 14 and the capacitor 15 are disposed side by side with each other and form the same layer in the PCU assembly 10A.

In the PCU assembly 10A, the reactor 14 and the capacitor 15, the water jacket 16, and the DC-DC converter 17 are sequentially stacked under the power stack 12. Therefore, for example, the PCU assembly 10A protrudes more on the lower side (transaxle 100 side) than in the case where the reactor 14 and the capacitor 15, and the DC-DC converter 17 are arranged side by side flatly under the water jacket 16.

When the PCU 10 is mounted on the PCU mounting portion 20, first, the PCU assembly 10A is attached in the PCU cover 18. Then, the PCU cover 18 in which the PCU assembly 10A is attached is fixed to the upper part of the PCU mounting portion 20 so as to cover the opening 20f of the PCU mounting portion 20.

At this time, in the PCU mounting portion 20, a portion of the lower part of the PCU assembly 10A, for example, a part of each of the reactor 14 and the DC-DC converter 17 is positioned in the recessed space formed between the first rotary electric machine MG1 and the second rotary electric machine MG2.

Specifically, as illustrated in FIG. 3, when the PCU 10 is mounted on the PCU mounting portion 20, a portion of the lower part of the PCU 10 is positioned in the space surrounded by line D, the first rotary electric machine MG1, and the second rotary electric machine MG2. Line D connects an intersection point B of the center line of the second rotary electric machine MG2 in the vertical direction and the transaxle case 2 and an intersection C of the tangent of the first rotary electric machine MG1 intersecting the center line of the first rotary electric machine MG1 in the horizontal direction and the transaxle case 2. In other words, in the cross section orthogonal to the axial direction of the transaxle case 2, a portion of the lower part of the PCU 10 is positioned in an area F2 surrounded by the rear wall 20b and the bottom wall 20c of the PCU mounting portion 20 and line D.

As a result, in mounting the PCU 10 on the transaxle case 2, the recessed space formed between first rotary electric machine MG1 and the second rotary electric machine MG2 is effectively used, whereby the height of the PCU 10 mounted on transaxle case 2 can be kept low and the arrangement of the PCU 10 can be improved.

Here, in the present embodiment, in mounting the PCU 10 on the transaxle case 2, it is possible to install the PCU assembly 10A in the PCU mounting portion 20 provided on the transaxle case 2 without mounting the PCU assembly 10A in the PCU cover 18, and thereafter fix the PCU cover 18 on the top of the PCU mounting portion 20. This makes it possible to improve the workability in mounting the PCU 10 on the transaxle case 2. Furthermore, as described above, the PCU assembly 10A is mounted in the PCU cover 18, and then the PCU 10 is mounted on the PCU mounting portion 20, whereby the entry of foreign matter into the PCU 10 (PCU assembly 10A) can be suppressed from the time when the PCU assembly 10A is assembled until the PCU 10 is mounted on the PCU mounting portion 20.

Furthermore, in the present embodiment, the inside of the transaxle case 2 in which the first rotary electric machine MG1 and the second rotary electric machine MG2 are disposed and the inside of the PCU mounting portion 20 on which the PCU 10 is mounted are divided by the rear wall 20b and the bottom wall 20c. In the present embodiment, the DC-DC converter 17 of the PCU 10 is cooled by the water jacket 16.

Furthermore, in the present embodiment, the PCU 10 side and the transaxle 100 side are electrically connected by bus bar connection with the PCU-side bus bar 13 and the transaxle-side bus bar 41 in the PCU mounting portion 20.

The transaxle-side bus bar 41 is provided on a terminal board 40, illustrated in FIG. 4, with a portion thereof protruding from the bottom wall 20c, from the transaxle 100 side to the PCU 10 side. The terminal board 40 is located beside the DC-DC converter 17 on the lower side of the PCU 10 and on the right side in the lateral direction of the vehicle. The terminal board 40 may be located beside the DC-DC converter 17 on the lower side of the PCU 10 and on the left side in the lateral direction of the vehicle.

In the present embodiment, the terminal board 40 and the transaxle-side bus bar 41 can be configured not to be in contact with the components constituting the PCU 10, and the height (mounting height) of the PCU 10 mounted on the transaxle case 2 can be kept lower than in the case where the terminal board 40 is positioned below the DC-DC converter 17 of the PCU 10.

Figure 6:
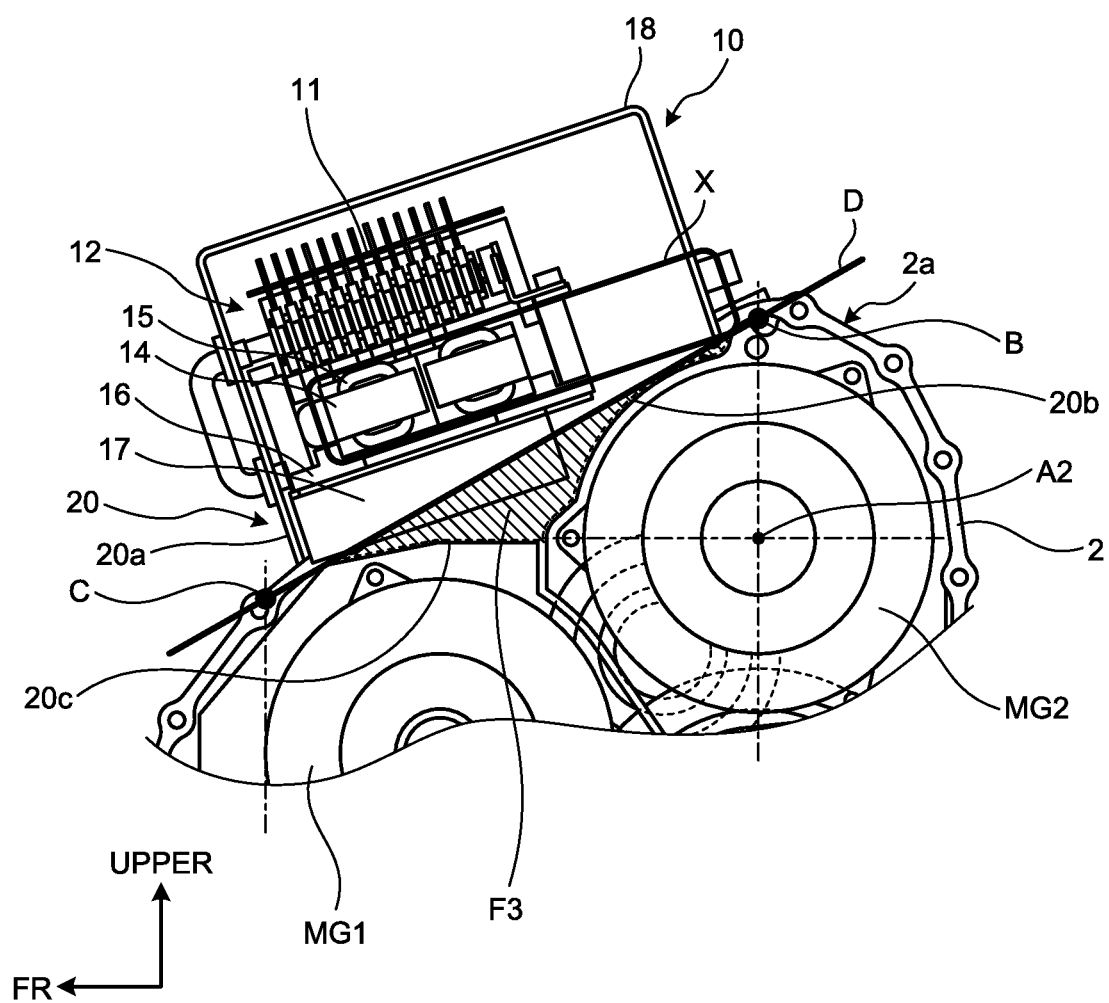
FIG. 6 is a view illustrating a case where the PCU is mounted on the PCU mounting portion with an inclination from the horizontal direction.

FIG. 6 is a view illustrating a case where the PCU 10 is mounted on the PCU mounting portion 20 with an inclination from the horizontal direction. In the present embodiment, as illustrated in FIG. 6, the PCU 10 may be mounted on the PCU mounting portion 20 with an inclination with respect to the horizontal direction.

In this state, as illustrated in FIG. 6, in a cross section orthogonal to the axial direction of the transaxle case 2, a portion of the lower part of the PCU 10 is positioned in an area F3 surrounded by the rear wall 20b and the bottom wall 20c of the PCU mounting portion 20 and line D. In FIG. 6, a part of the DC-DC converter 17 is positioned in the area F3.

As illustrated in FIG. 6, the PCU 10 is mounted on the PCU mounting portion 20 with the PCU 10 mounted with an inclination with respect to the horizontal direction and a portion of the lower part of the PCU 10 positioned in the area F3, whereby the height (mounting height) of the PCU 10 mounted on the transaxle case 2 can be kept low.

Furthermore, when PCU 10 is arranged obliquely with respect to the transaxle case 2, the reactor 14 and the capacitor 15 may be extended in the longitudinal direction and may be flattened to keep the height of the PCU 10 low, for example, so as to fit within the frame in FIG. 6.

Figure 7:
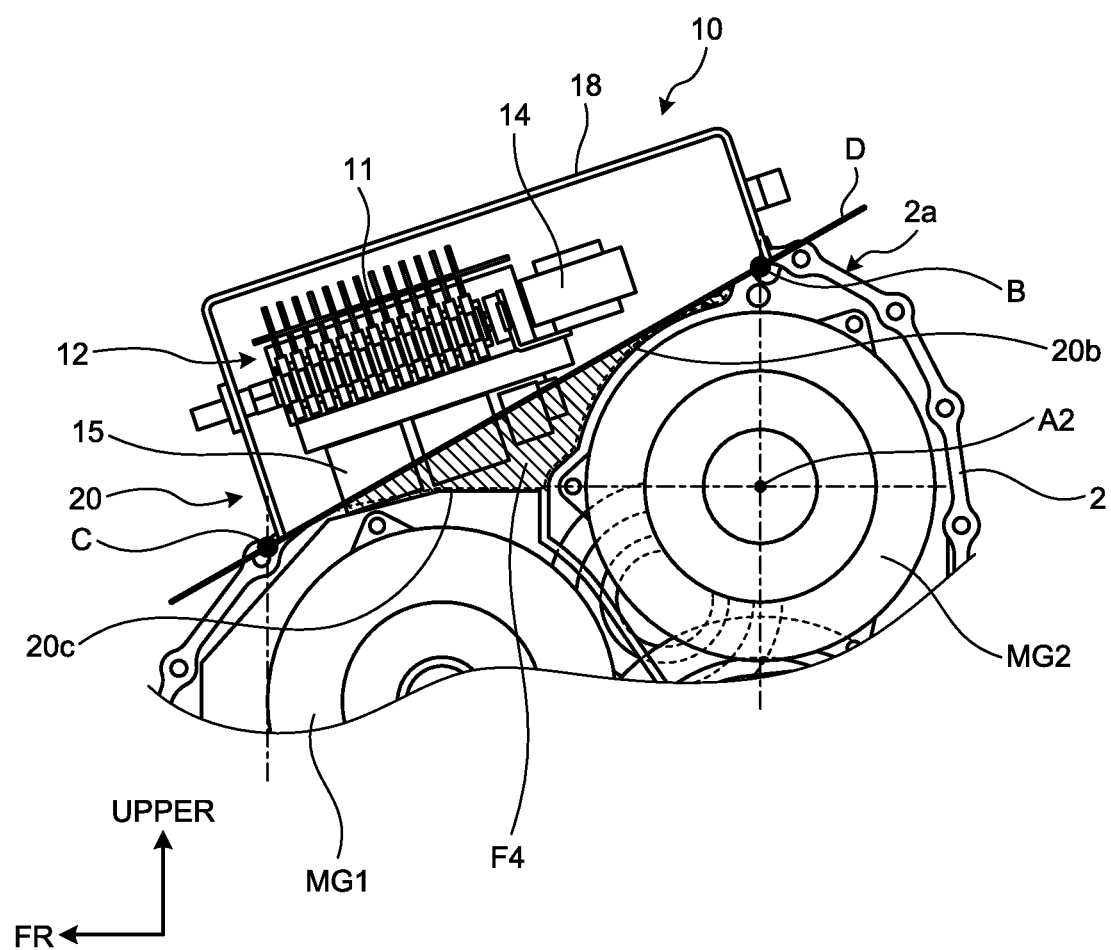
FIG. 7 is a view illustrating a case where the PCU is not provided with a DC-DC converter.

FIG. 7 is a diagram illustrating a case where the PCU 10 is not provided with the DC-DC converter 17. In the present embodiment, as illustrated in FIG. 7, the PCU 10 may not have the DC-DC converter 17. In this configuration, for example, as illustrated in FIG. 7, when the PCU 10 is mounted on the PCU mounting portion 20 with an inclination with respect to the horizontal direction, the capacitor 15 is disposed under the power stack 12 of the PCU 10 toward the transaxle case 2. In addition, the reactor 14 is disposed in the longitudinal direction of the power stack 12 so as to be in contact with the cooler that constitutes the power stack 12.

As illustrated in FIG. 7, in a cross section orthogonal to the axial direction of the transaxle case 2, the PCU 10 is mounted on the PCU mounting portion 20 with a portion of the lower part of the PCU 10 positioned in an area F4 surrounded by the rear wall 20b and the bottom wall 20c of the PCU mounting portion 20 and line D. In FIG. 7, a part of the capacitor 15 is located in the area F4.

As illustrated in FIG. 7, the PCU 10 is mounted on the PCU mounting portion 20 with the PCU 10 not provided with the DC-DC converter 17 disposed with an inclination with respect to the horizontal direction and a portion of the lower part (capacitor 15) of the PCU 10 positioned in the area F4, whereby the height of the PCU 10 mounted on the transaxle case 2 can be reduced.

Second Embodiment

A second embodiment of a vehicle driving device according to the present disclosure will be described below. A description on parts of the second embodiment that are the same as those in the first embodiment will be omitted as appropriate.

Figure 8:
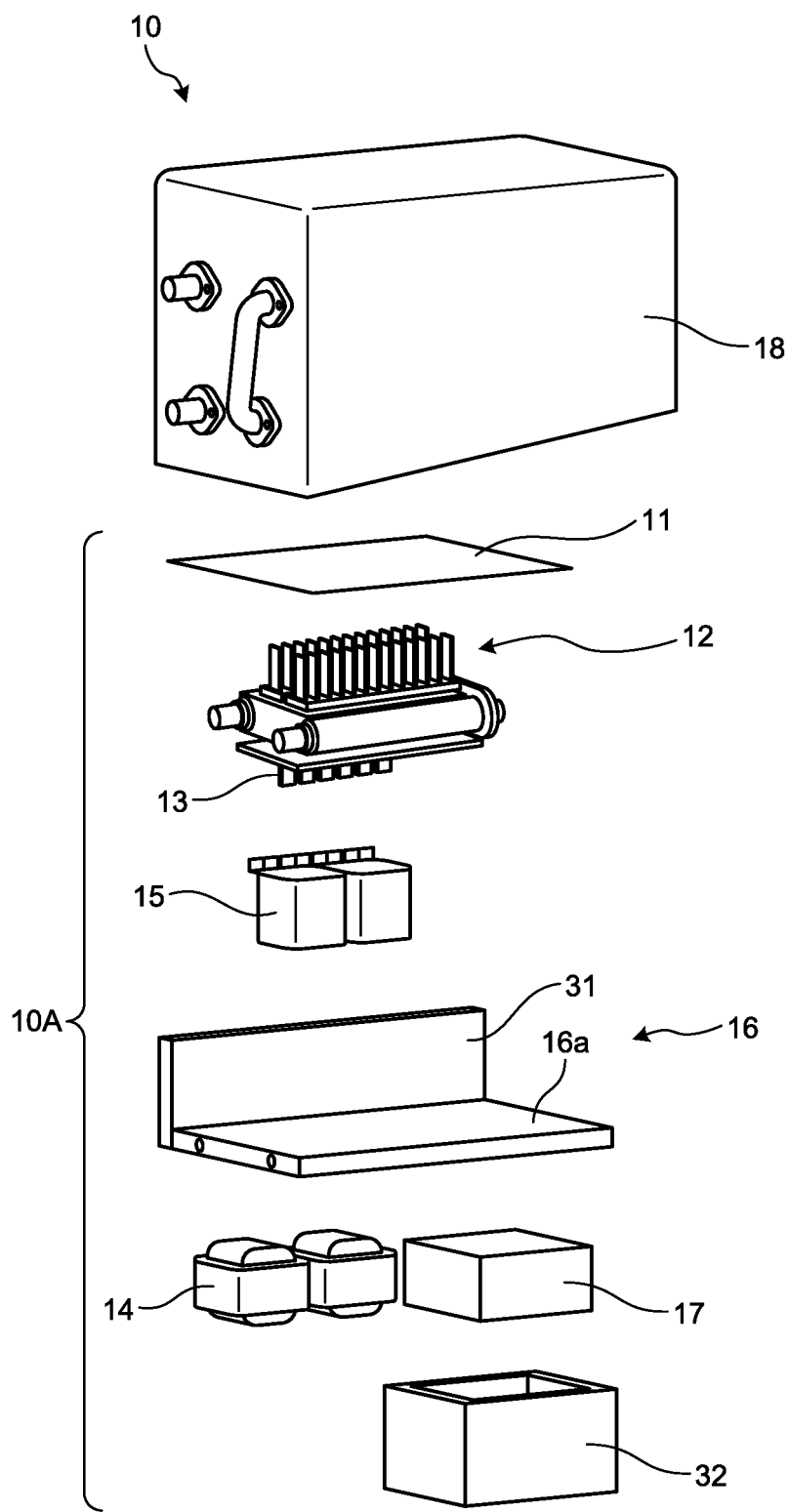
FIG. 8 is an exploded view of the PCU used for a vehicle driving device according to a second embodiment.

FIG. 8 is an exploded view of the PCU 10 used for a vehicle driving device according to a second embodiment. As illustrated in FIG. 8, in the present embodiment, the PCU 10 includes the control board 11, the power stack 12, the PCU-side bus bar 13, the reactor 14, the capacitor 15, the water jacket 16, the DC-DC converter 17, the PCU cover 18, a heat shielding wall 31, and a heat shielding cover 32, for example.

The water jacket 16 has a flat plate-like body 16a. The heat shielding wall 31 is mounted upright on the upper surface of the body 16a at one end portion in the lateral direction. The heat shielding wall 31 is integrated with the water jacket 16 by aluminum die-cast, for example. The heat shielding wall 31 may be provided separately from or integrally with the body 16a of the water jacket 16. The heat shielding cover 32 has a box-shape with an open upper surface and is capable of covering the DC-DC converter 17. The heat shielding cover 32 is formed of sheet metal, for example.

In the present embodiment, the PCU 10 has a multilayer structure in the height direction, and the control board 11, the power stack 12, the capacitor 15, the water jacket 16, the reactor 14 and the DC-DC converter 17, and the heat shielding cover 32 are stacked in order from the upper side (side opposite to the transaxle 100 side) in the height direction of the PCU 10 and integrated to form the PCU assembly 10A.

The PCU assembly 10A has a three-layer structure having an upper layer, an intermediate layer, and a lower layer in the height direction. The upper layer is provided with the control board 11 and the power stack 12. The intermediate layer is provided with the capacitor 15. The lower layer is provided with the reactor 14 and the DC-DC converter 17, and the heat shielding cover 32. The water jacket 16 is disposed between the intermediate layer and the lower layer. With this configuration, the water jacket 16 can cool the reactor 14 and the DC-DC converter 17, for example.

In the present embodiment, in the PCU assembly 10A, for example, the PCU assembly 10A protrudes more on the lower side (transaxle 100 side) than in the case where the reactor 14 and the capacitor 15, and the DC-DC converter 17 are arranged side by side flatly under the water jacket 16.

Figure 9:
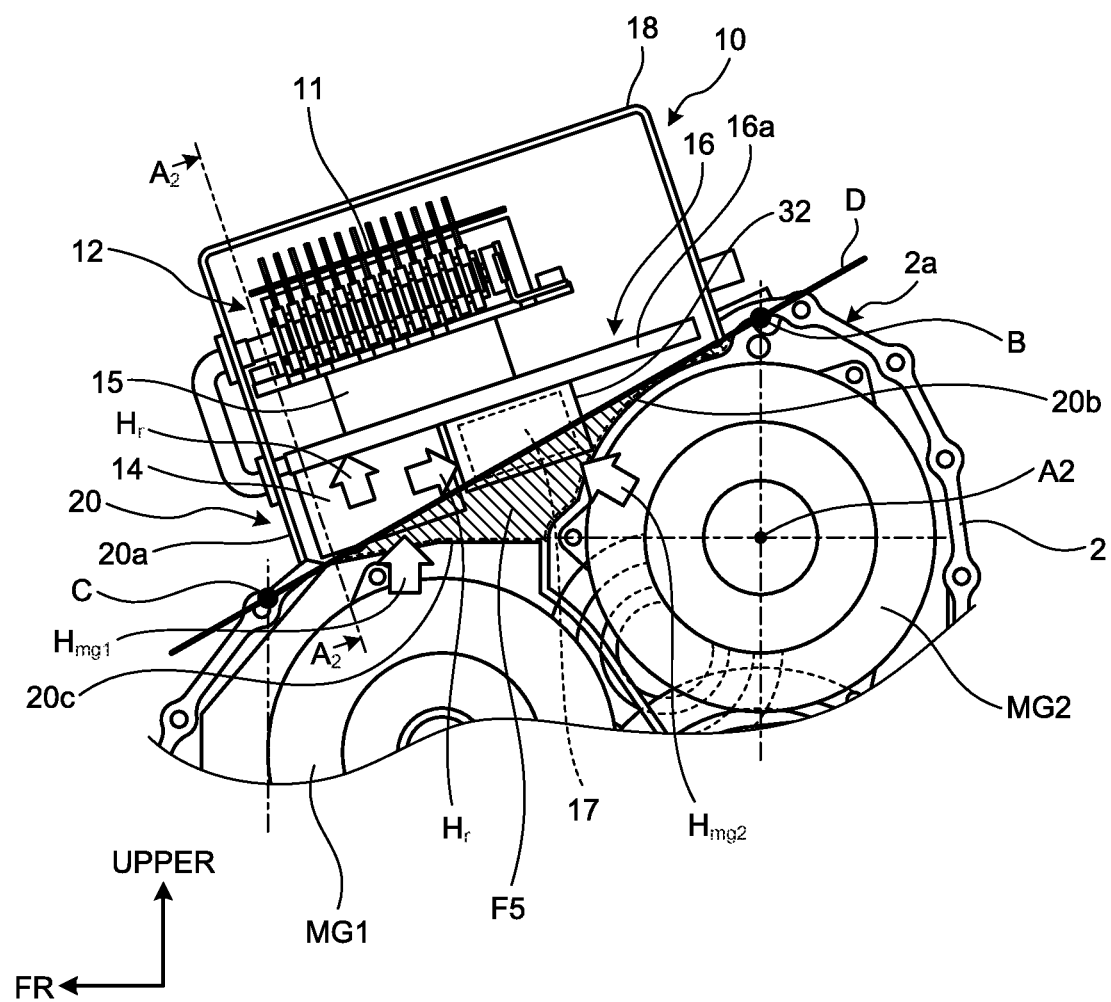
FIG. 9 is a view illustrating the PCU mounted on a PCU mounting portion with an inclination from the horizontal direction.
Figure 10:
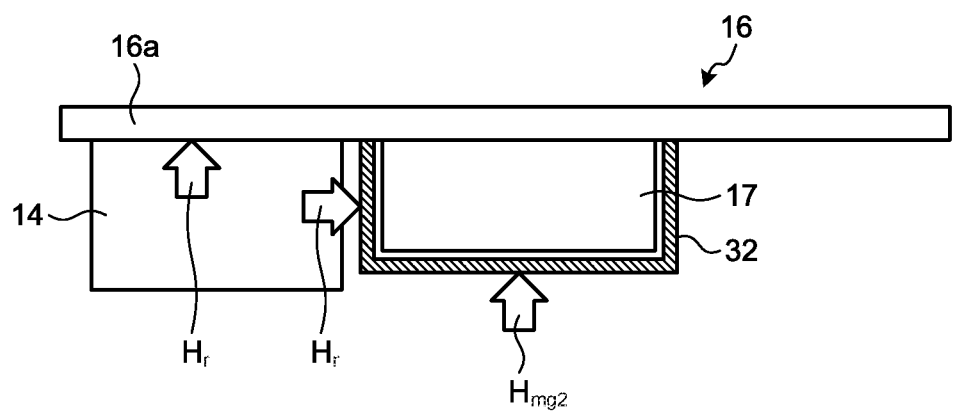
FIG. 10 is a view schematically illustrating a lower layer of a PCU assembly and its vicinity.
Figure 11:
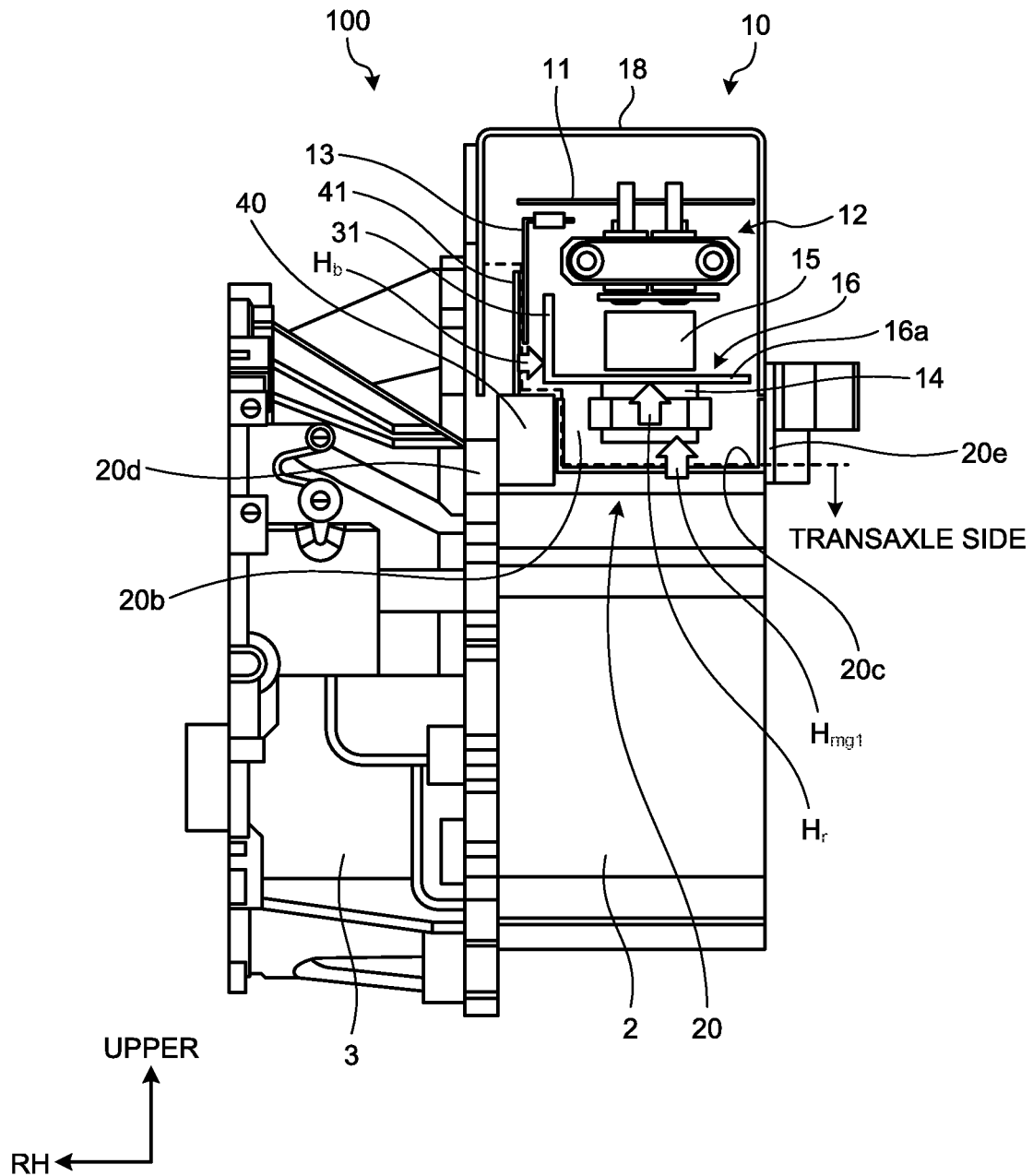
FIG. 11 is a view of the PCU mounting portion on which the PCU is mounted, cut along the $A_2$-$A_2$ cross section in FIG. 9.

FIG. 9 is a view illustrating the PCU 10 mounted on the PCU mounting portion 20 with an inclination from the horizontal direction. FIG. 10 is a view schematically illustrating a lower layer of the PCU assembly 10A and its vicinity. Note that FIG. 10 illustrates a cross section of the heat shielding cover 32 for the sake of easy understanding of illustration. FIG. 11 is a view of the PCU mounting portion 20 on which the PCU 10 is mounted, cut along the $A_2$-$A_2$ cross section in FIG. 9.

As illustrated in FIG. 9, in a cross section orthogonal to the axial direction of the transaxle case 2, a portion of the lower part of the PCU 10 is positioned in an area F5 surrounded by the rear wall 20b and the bottom wall 20c of the PCU mounting portion 20 and line D. In FIG. 9, a part of the reactor 14, a part of the DC-DC converter 17, and a part of the heat shielding cover 32 are positioned in the area F5.

In the present embodiment, as illustrated in FIG. 9, the PCU 10 is mounted on the PCU mounting portion 20 with a portion of the lower part of the PCU 10 positioned in the area F5, whereby the height (mounting height) of the PCU 10 mounted on the transaxle case 2 can be kept low. Also in the present embodiment, the PCU 10 is mounted with an inclination with respect to the horizontal direction, whereby the height (mounting height) of the PCU 10 mounted on the transaxle case 2 can be further kept low.

In the present embodiment, the reactor 14, which is resistant to heat, is disposed in the vicinity of the transaxle case 2. In addition, the power stack 12 and the capacitor 15 are disposed above the body 16a of the water jacket 16.

As illustrated in FIG. 9 to FIG. 11, when the PCU 10 is energized, the reactor 14 generates heat $H_r$. Also as illustrated in FIG. 9 to FIG. 11, in the transaxle 100, heat $H_{mg1}$ generated along with operation of the first rotary electric machine MG1, heat $H_{mg2}$ generated along with operation of the second rotary electric machine MG2, and the like are transferred to the PCU 10 side through the transaxle case 2. For this reason, in the present embodiment, the reactor 14, which is resistant to heat, is disposed in the lower layer of the PCU assembly 10A constituting the PCU 10, and the reactor 14 is disposed in the vicinity of the transaxle case 2.

In the present embodiment, the power stack 12 including the power card, which is weak against heat, and the capacitor 15, which is weak against heat, are disposed above the body 16a of the water jacket 16. With this configuration, the body 16a of the water jacket 16 can block the heat $H_{mg1}$ and the heat $H_{mg2}$ transferred to the PCU 10 side through the transaxle case 2. The body 16a of the water jacket 16 can also block part of the heat $H_r$ generated by the reactor 14 disposed below the body 16a of the water jacket 16. With this configuration, in the present embodiment, impact of heat on the power card of the power stack 12 and the capacitor 15 can be reduced.

As illustrated in FIG. 9 and FIG. 10, the reactor 14 and the DC-DC converter 17 are provided in contact with the lower surface of the body 16a of the water jacket 16. The reactor 14 and the DC-DC converter 17 are arranged side by side along the lower surface of the body 16a with a distance therebetween. The heat shielding cover 32 is positioned at least between the DC-DC converter 17 and the transaxle case 2 and between the DC-DC converter 17 and the reactor 14, and is connected to the lower surface of the body 16a of the water jacket 16 so as to cover the entire circumference of the DC-DC converter 17 together with the body 16a of the water jacket 16.

With this configuration, the heat shielding cover 32 can block the heat $H_{mg1}$ and the heat $H_{mg2}$ transferred to the PCU 10 side through the transaxle case 2 and the heat $H_r$ generated by the reactor 14 and reduce impact of heat on the DC-DC converter 17. Furthermore, since the water jacket 16 is connected to the heat shielding cover 32, the water jacket 16 can cool the heat shielding cover 32 that has received heat, whereby the heat insulation property of the heat shielding cover 32 can be enhanced.

The shape of the heat shielding cover 32 is not limited to the box-shape, and may be a cornered U-form, for example. In other words, the heat shielding cover 32 may include a first wall disposed between the reactor 14 and the DC-DC converter 17, a second wall facing the first wall with the DC-DC converter 17 interposed therebetween, and a third wall facing the water jacket 16 with the DC-DC converter 17 interposed therebetween and coupling the first wall with the second wall. For the heat shielding cover 32 with this configuration, it suffices to connect the first wall and the second wall to the lower surface of the body 16a of the water jacket 16.

As illustrated in FIG. 11, in the present embodiment, the transaxle-side bus bar 41 provided on the terminal board 40 is located beside the capacitor 15 of the PCU 10. Upon being energized, the transaxle-side bus bar 41 generates heat. For this reason, in the present embodiment, as illustrated in FIG. 11, the heat shielding wall 31 connected to the water jacket 16 is provided between the transaxle-side bus bar 41 and the capacitor 15. With this configuration, the heat shielding wall 31 can block heat $H_b$ generated by the transaxle-side bus bar 41 and reduce impact of heat on the capacitor 15. Furthermore, since the water jacket 16 is connected to the heat shielding wall 31, the water jacket 16 can cool the heat shielding wall 31 that has received heat, whereby the heat insulation property of the heat shielding wall 31 can be enhanced.

Figure 12:
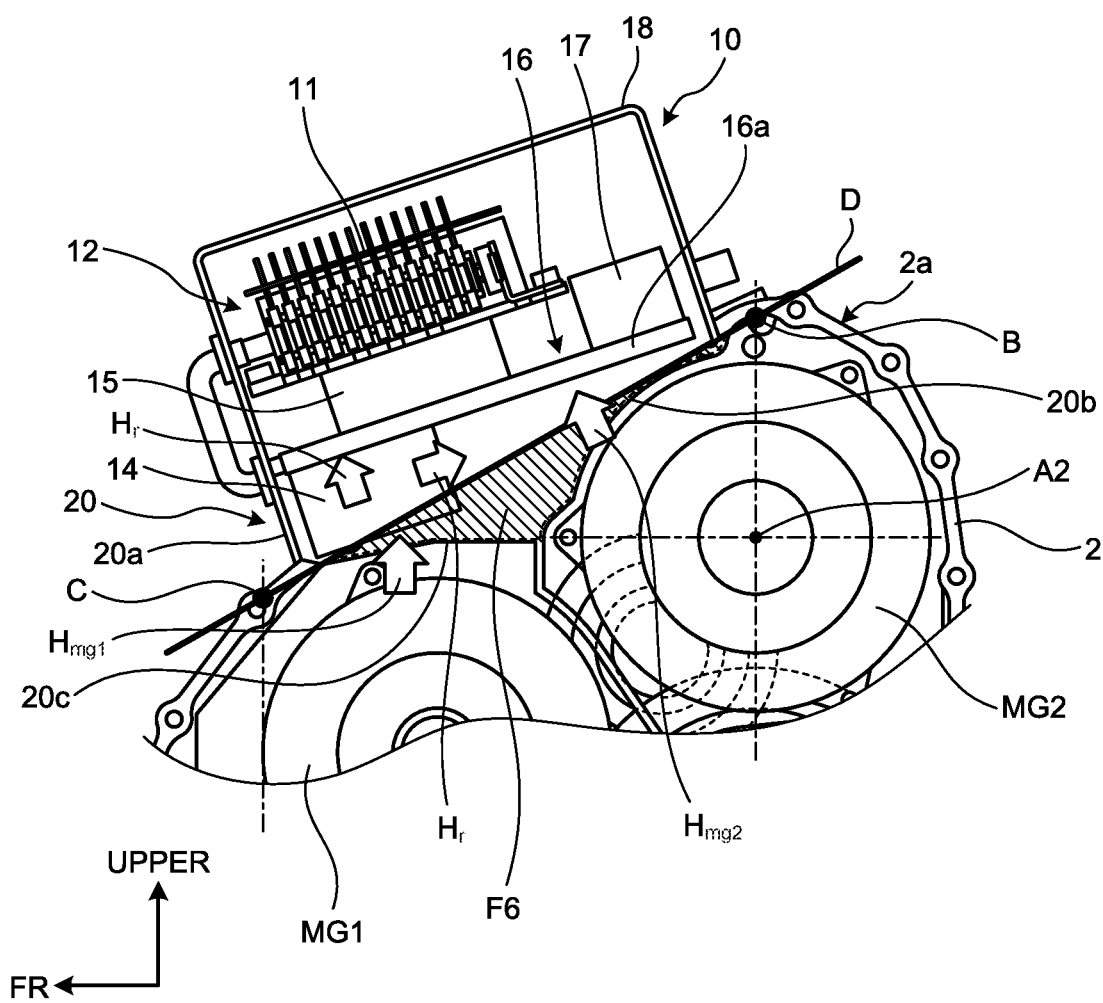
FIG. 12 is a view illustrating a case where the DC-DC converter is disposed above a body of a water jacket.

FIG. 12 is a view illustrating a case where the DC-DC converter 17 is disposed above the body 16a of the water jacket 16. In the present embodiment, as illustrated in FIG. 12, the DC-DC converter 17 may be disposed above the body 16a of the water jacket 16. In other words, the DC-DC converter 17, which is disposed in the lower layer of the PCU assembly 10A in the PCU 10 illustrated in FIG. 9, is disposed in the intermediate layer of the PCU assembly 10A together with the capacitor 15 in the PCU 10 illustrated in FIG. 12.

In FIG. 12, in the cross section orthogonal to the axial direction of the transaxle case 2, in an area F6 surrounded by the rear wall 20b and the bottom wall 20c of the PCU mounting portion 20 and line D, a portion of the lower part of the PCU 10, more specifically, a part of the reactor 14 is located.

As illustrated in FIG. 12, since the DC-DC converter 17 is disposed above the body 16a of the water jacket 16, the body 16a of the water jacket 16 can block the heat $H_{mg1}$ and the heat $H_{mg2}$ transferred to the PCU 10 side through the transaxle case 2 and the heat $H_r$ generated by the reactor 14. With this configuration, impact of heat on the DC-DC converter 17 can be reduced. Furthermore, the body 16a of the water jacket 16 blocks heat, which eliminates the heat shielding cover 32 that covers the DC-DC converter 17 and blocks heat.

In the PCU 10 according to the present embodiment, the control board 11, the power stack 12, the reactor 14, the capacitor 15, and the DC-DC converter 17 may be fixed to the water jacket 16, but the present disclosure is not limited thereto.

In the PCU 10 according to the present embodiment, the upper surface of the PCU cover 18 may have an opening on the upper surface, and an upper cover that is detachably attached to the PCU cover 18 may be provided so that the opening can be opened and closed. In such a configuration, the control board 11 and the power stack 12, provided on the upper layer of the PCU assembly 10A, are not fixed to the water jacket 16. On the other hand, at least one of the reactor 14, the capacitor 15, and the DC-DC converter 17 may be fixed to the water jacket 16. The control board 11 and the power stack 12 are assembled on the upper side in the PCU cover 18, through the opening on the upper surface of the PCU cover 18, and then the opening on the upper surface of the PCU cover 18 is closed by the upper cover. The capacitor 15, the water jacket 16, the reactor 14, and the DC-DC converter 17 are assembled on the lower side on the PCU cover 18, through the opening on the lower surface of the PCU cover 18. Thus, the ease of assembly of the PCU 10 can be improved.

In the vehicle driving device according to the present disclosure, the power control device is shaped to be fitted to the recessed space formed between the first rotary electric machine and the second rotary electric machine, whereby the recessed space is effectively used. Thus, the height (mounting height) of the power control device mounted on the case can be kept low, and an effect of improving the arrangement of the power control device can be achieved.

According to an embodiment, the DC-DC converter can be cooled by the water jacket, and the power control device can be shaped to be fitted to the recessed space formed between the outer circumferential surface of the first rotary electric machine and the outer circumferential surface of the second rotary electric machine.

According to an embodiment, the height of the power control device mounted on the mounting portion of the case can be reduced.

According to an embodiment, it is possible to enhance the maintainability of the power control device.

According to an embodiment, it is possible to suppress the entry of foreign matter into the power control device.

According to an embodiment, it is possible to improve the workability when mounting the power control device in the case.

According to an embodiment, impact of heat from the reactor and the transaxle can be reduced.

According to an embodiment, heat from the second connection terminal is blocked, whereby impact of heat on the capacitor can be reduced.

According to an embodiment, the heat shielding cover can block the heat from the transaxle, whereby impact of heat on the DC-DC converter can be reduced.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicle driving device comprising:
   a case that accommodates therein a first rotary electric machine and a second rotary electric machine arranged with rotation axes thereof parallel to each other and radially adjacent to each other; and
   a power control device that controls electric power supplied to the first rotary electric machine and the second rotary electric machine, wherein
   the power control device has a three-layer structure having an upper layer, an intermediate layer, and a lower layer in the height direction,
   the upper layer is provided with a control board, a power card, and a cooler,
   the intermediate layer is provided with a capacitor,
   the lower layer is provided with a reactor, and
   a water jacket is disposed between the intermediate layer and the lower layer.

2. The vehicle driving device according to claim 1, wherein
   a terminal board holding a second connection terminal electrically connected to a first connection terminal included in the power control device is disposed beside the capacitor, and
   a heat shielding wall connected to the water jacket is provided between the capacitor and the second connection terminal.

3. The vehicle driving device according to claim 1, wherein
   the lower layer is further provided with a DC-DC converter, and
   a heat shielding cover connected to the water jacket is provided between the DC-DC converter and the case.

4. The vehicle driving device according to claim 3, wherein the reactor, the heat shielding cover, and the DC-DC converter are connected to an external surface of the water jacket that faces away from the intermediate layer.

5. The vehicle driving device according to claim 1, wherein the reactor is connected to an external surface of the water jacket that faces away from the intermediate layer.

* * * * *